(12) United States Patent
Baello et al.

(10) Patent No.: US 12,132,027 B2
(45) Date of Patent: Oct. 29, 2024

(54) SEMICONDUCTOR DEVICE ASSEMBLY WITH PRE-REFLOWED SOLDER

(71) Applicant: Texas Instruments Incorporated, Dallas, TX (US)

(72) Inventors: James Raymond Maliclic Baello, Pampanga (PH); Steffany Ann Lacierda Moreno, Tarlac (PH); Jose Carlos Arroyo, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 83 days.

(21) Appl. No.: 17/074,182

(22) Filed: Oct. 19, 2020

(65) Prior Publication Data

US 2022/0122940 A1    Apr. 21, 2022

(51) Int. Cl.
*H01L 23/00* (2006.01)

(52) U.S. Cl.
CPC .............. *H01L 24/81* (2013.01); *H01L 24/13* (2013.01); *H01L 24/16* (2013.01); *H01L 2224/13147* (2013.01); *H01L 2224/16227* (2013.01); *H01L 2224/16245* (2013.01); *H01L 2224/81024* (2013.01); *H01L 2224/81815* (2013.01); *H01L 2924/1815* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ......... H01L 24/81; H01L 24/16; H01L 24/13; H01L 2924/1815; H01L 2224/16227; H01L 2924/19042; H01L 2224/81024; H01L 2924/19041; H01L 2924/19105; H01L 2224/13147; H01L 2924/19043; H01L 2224/16245; H01L 2224/81815
See application file for complete search history.

(56) References Cited

U.S. PATENT DOCUMENTS

| | | | |
|---|---|---|---|
| 9,219,052 B2 | 12/2015 | Partosa et al. | |
| 10,700,011 B2 * | 6/2020 | Yang | H01L 24/96 |
| 2005/0275096 A1* | 12/2005 | Zeng | H01L 24/05 257/737 |
| 2007/0228105 A1* | 10/2007 | Oshika | H05K 3/3457 228/101 |
| 2008/0182124 A1* | 7/2008 | Gruber | B23K 35/262 428/646 |
| 2009/0197103 A1* | 8/2009 | Shih | B23K 1/008 428/457 |
| 2009/0291524 A1* | 11/2009 | Takahashi | H01L 24/75 438/108 |
| 2011/0215466 A1* | 9/2011 | Hsu | H01L 24/81 257/737 |

(Continued)

*Primary Examiner* — Douglas W Owens
(74) *Attorney, Agent, or Firm* — Ronald O. Neerings; Frank D. Cimino

(57) ABSTRACT

A semiconductor device assembly includes a package substrate having a top side including a plurality of bondable features, at least one integrated circuit (IC) die including a substrate having at least a semiconductor surface including circuitry configured for realizing at least one function including nodes coupled to bond pads with metal posts on the bond pads. The metal posts are attached by a solder joint to the bondable features. The solder joint has a void density of less than or equal to ($\geq$) 5% of a cross-sectional area of the solder joint.

26 Claims, 3 Drawing Sheets

(56) References Cited

U.S. PATENT DOCUMENTS

| | | | |
|---|---|---|---|
| 2014/0197037 A1* | 7/2014 | Buckalew | C25D 5/611 |
| | | | 205/125 |
| 2015/0325507 A1* | 11/2015 | Uzoh | B23K 1/0016 |
| | | | 257/737 |
| 2019/0279958 A1* | 9/2019 | Chen | H01L 24/81 |
| 2019/0393138 A1* | 12/2019 | Milo | H01L 23/3107 |
| 2021/0013138 A1* | 1/2021 | Kim | H01L 21/565 |
| 2022/0093549 A1* | 3/2022 | Chu | B23K 35/262 |
| 2022/0093581 A1* | 3/2022 | Musiol | H01L 24/45 |

* cited by examiner

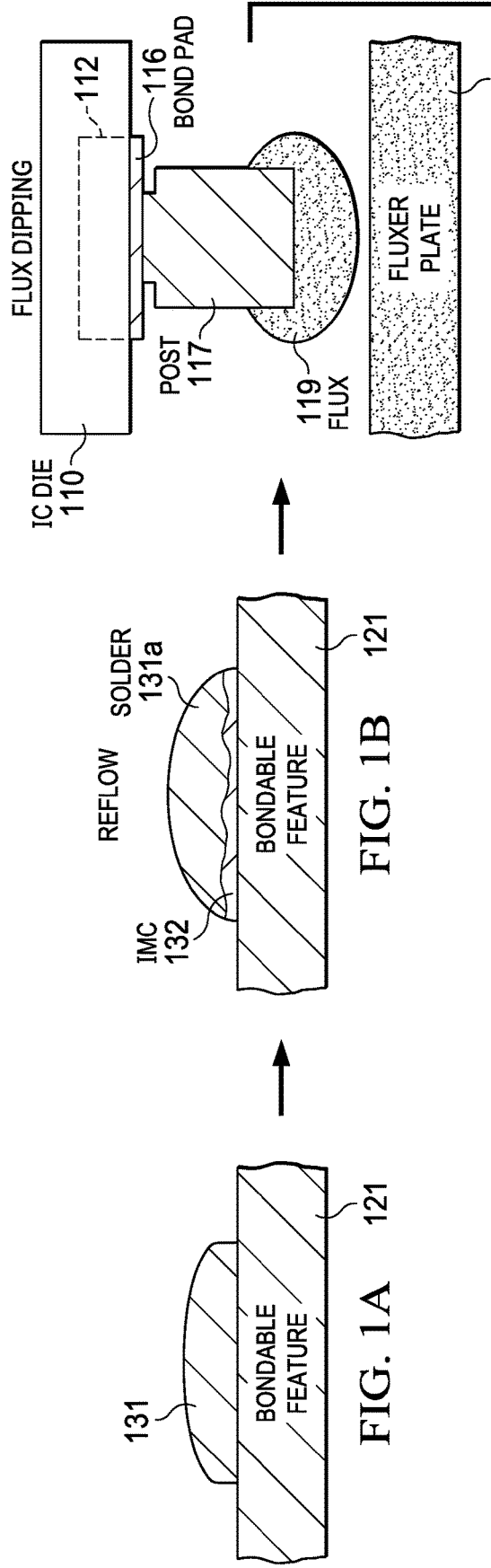

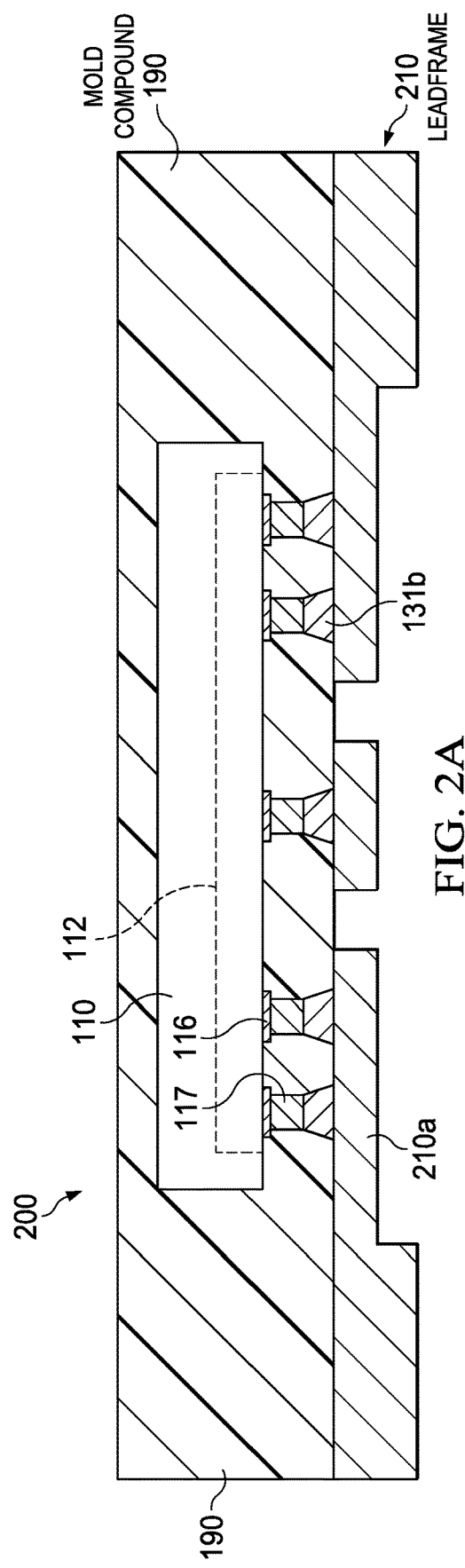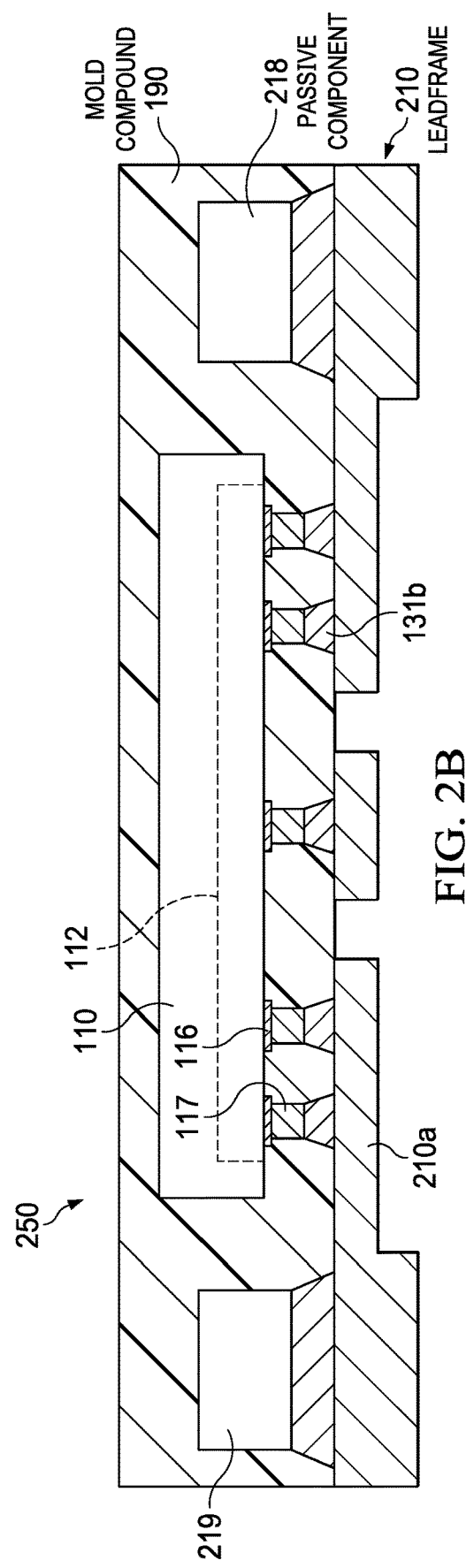

SEMICONDUCTOR DEVICE ASSEMBLY WITH PRE-REFLOWED SOLDER

FIELD

This Disclosure relates to flip chip device assemblies having solder connections between the die and the package substrate.

BACKGROUND

A variety of semiconductor chip packages are known that provide support for an integrated circuit (IC) die, provide protection from the environment, and enable surface mounting of the IC die to and interconnection with a printed circuit board (PCB). One conventional package substrate configuration includes a leadframe having a die pad and wire bond pads. Another conventional package substrate configuration comprises an organic substrate.

Leadframe-based semiconductor packages are well known and widely used in the electronics industry to house, mount, and interconnect a variety of different IC die types. A conventional leadframe is typically die-stamped from a sheet of flat-stock metal, and includes a plurality of metal leads temporarily held together in a planar arrangement about a central region during package manufacture by a rectangular frame comprising a plurality of expendable reports referred to commonly as "dam-bars." A die pad for an IC die is supported in the central region by "tie-bars" that attach to the frame. The leads extend from a first end integral with the frame to an opposite second end adjacent to but spaced apart from, the die pad.

In a flip chip on leadframe package arrangement, an IC die having solder bumps on its bond pads, sometimes having the solder bumps on a copper post that is on the bond pads, is flipped (circuit side down) onto a leadframe having wirebond pads, where the IC die is bonded to the die pad and is electrically coupled to the wirebond pads through reflowing of the solder bump. The solder bumps may be applied to the IC die using a solder ball drop technique. Texas Instruments provides HOTROD Quad flatpack No Lead (QFN) packages which are leadless packages specifically designed for power applications. HOTROD QFNs have solder land pads on all sides of the package, as well as power buses for enhanced current charging capability.

Organic substrates are also known to be used as base materials in semiconductor applications and manufacturing. Unlike inorganic substrates such as silicon, the organic substrates comprise organic small molecules or polymers. Organic small molecules include polycyclic aromatic compounds, such as pentacene, anthracene, and rubrene. Packaging materials are not only used for mechanical or environmental safety, but they also provide an electrically conductive interconnect between the IC die and PCBs. Organic packaging materials, similar to other packaging materials, also facilitate heat distribution, signal distribution, manufacturability, and serviceability, as well as power distribution. Organic packaging materials vary in functionality and dimensions. The organic substrate can also comprise what is commonly referred to as a buildup substrate.

A variety of solder compositions are known. One commercially available solder composition is marketed as SAC305, which comprises a lead-free alloy that contains 96.5% tin, 3% silver, and 0.5% copper. SAC305 satisfies the Japan Electronic Industries Development Association (JEIDA) recommendation for lead-free solder.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a semiconductor device assembly that comprises a package substrate having a top side including a plurality of bondable features, at least one IC die including a substrate having at least a semiconductor surface including circuitry configured for realizing at least one function including nodes coupled to bond pads with metal posts on the bond pads. The metal posts are attached by a solder joint to the bondable features. Enabled by a disclosed assembly process including both a first and second solder reflow step, pre-reflowed solder is provided from the first solder reflow process on the bonding features of the package substrate. Following the placing the IC die so that the metal posts are placed onto the bondable features of the package substrate, a second reflow process forms a solder joint between the bondable features of the package substrate and the metal posts of the IC die. The solder joint has a void density of less than or equal to (≤) 5% of its cross-sectional area.

BRIEF DESCRIPTION OF THE DRAWINGS

Reference will now be made to the accompanying drawings, which are not necessarily drawn to scale, wherein:

FIG. 1A-E are cross-sectional views that depict a series of steps involved in a method of forming a disclosed semiconductor device assembly that includes a solder reflow step for the bondable feature(s) of a package substrate prior to mounting of the metal posts on the IC die onto the bondable features of the package substrate, according to an example aspect.

FIG. 2A is a cross-sectional view of a semiconductor device assembly shown as a flip chip on lead (FCOL) plastic QFN package that has a disclosed solder joint between the metal posts on the IC die and lead terminals of the leadframe, according to an example aspect.

FIG. 2B is a cross-sectional view of a semiconductor device assembly shown as a FCOL plastic QFN package that has a disclosed solder joint between the metal posts on the IC die and lead terminals of the leadframe, where the QFN package further comprises an optional passive device and an optional second IC die that also have bonding features, such as metal posts, attached by the solder joint to the lead terminals of the leadframe.

DETAILED DESCRIPTION

Figure 3A:
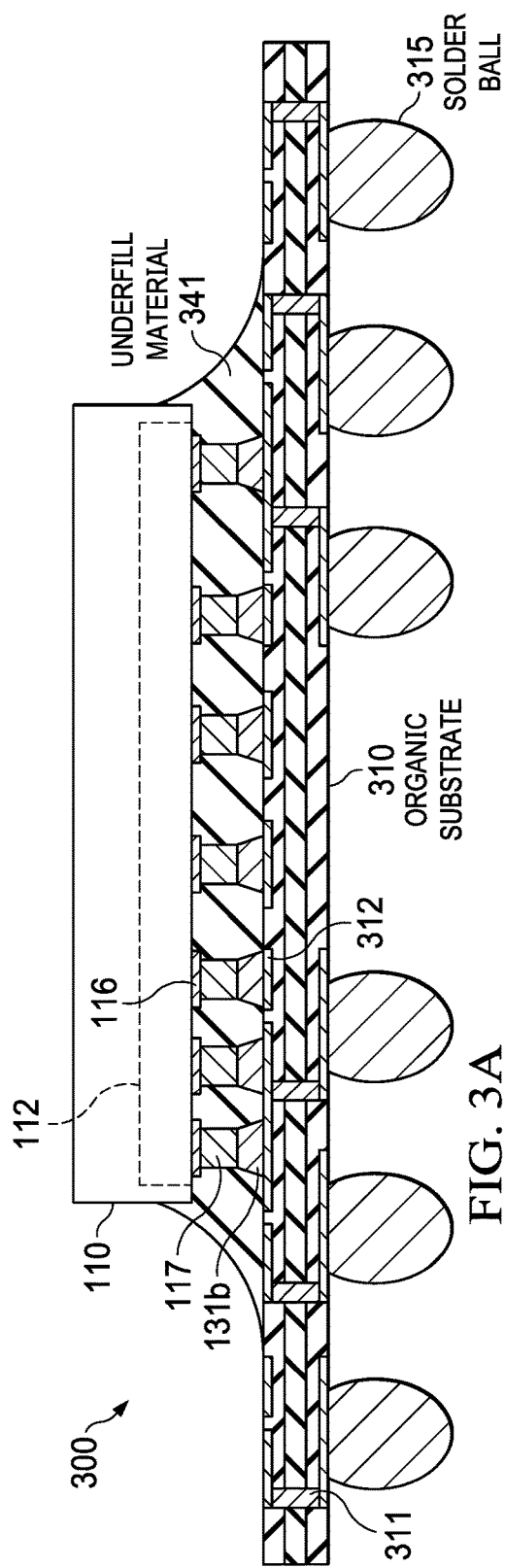
FIG. 3A is a cross-sectional view of a semiconductor device assembly that has disclosed solder joints comprising a solder bumped IC die flip chip mounted onto bondable features on the organic substrate, according to an example aspect.

Example aspects are described with reference to the drawings, wherein like reference numerals are used to designate similar or equivalent elements. Illustrated ordering of acts or events should not be considered as limiting, as some acts or events may occur in a different order and/or concurrently with other acts or events. Furthermore, some illustrated acts or events may not be required to implement a methodology in accordance with this Disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1A-E are cross-sectional views that depict a series of steps involved in a method of forming a disclosed semiconductor device assembly that includes the solder reflow step applied to the bondable features of the package substrate prior to mounting an IC die onto the bondable features of the package substrate, according to an example aspect. FIG. 1A depicts the results after printing solder 131 generally in the form of solder paste onto the surface of a bondable feature 121 of a package substrate (package substrate not shown in FIGS. 1A-E, but see FIGS. 2A, 2B, 3A, 3B each described below). The printing of the solder can comprise screen printing using a screen-printing stencil, or other known solder-printing techniques such as solder dispensing, solder ball drop, or inkjet printing.

The package substrate can comprise essentially any structure one can mount an IC die on, including a leadframe, and also other package substrates such as a ceramic substrate, a Ball Grid Array (BGA) a Pin Grid Array (PGA), a printed circuit board (PCB), an organic substrate, a flexible plastic substrate, or a paper-based substrate. The bondable feature 121 can comprise a lead for a leaded leadframe or a lead terminal in the case of a leadless leadframe, or a metal pad in the case of the other package substrate types, such as an organic substrate.

FIG. 1B depicts the results after reflowing the solder 131 on the bondable feature 121. The solder reflow process can comprise a vacuum reflow process. An example solder reflow temperature range is 230 to 260° C. with a reflow time above liquidus (TAL) of 30 to 100 seconds. The reflowed solder is now shown as 131a. There is shown an Intermetallic compound (IMC) region 132 between the reflowed solder 131a and the bondable feature 121. The term IMC is defined by the JEDEC Solid State Technology Association to be "A substance formed when solder comes in contact with another metal at elevated temperature", where "the IMC is composed of multiple constituents from the solder and the other metal." "This material has unique mechanical and electrical properties, which are different from those of the initial solder and the other metallization."

FIG. 1C depicts the results for an IC die 110 after flux dipping a metal post 117 that is on a bond pad 116 of the IC die 110 using a fluxer plate 150. The flux dipping process can comprise a standard flux dipping process wherein the IC die 110 is dipped onto the fluxer plate 150 where flux 119 that is shown on the metal post 117 is supplied by a flux tank. The IC die 110 comprises a substrate including at least a semiconductor surface having circuitry 112 configured for realizing at least one function including some nodes of the circuitry 112 coupled to bond pads including the bond pad 116 shown, with the metal post 117 also sometimes referred to as a pillar, such as copper pillars, on the bond pads 116.

The circuitry 112 comprises circuit elements (including transistors, and generally diodes, resistors, capacitors, etc.) that may in one arrangement be formed in a substrate comprising an epitaxial layer on a bulk substrate material such as silicon configured together for generally realizing at least one circuit function. Example circuit functions include analog (e.g., amplifier or power converter), radio frequency (RF), digital, or non-volatile memory functions.

FIG. 1D depicts the results after placing the metal posts 117 of the IC die 110 onto the bondable feature 121 of the package substrate with the flux 119 being on a distal end of the metal posts 117. FIG. 1E depicts the results after a second reflow process to form solder joints between the metal posts 117 and the bondable feature 121. The second reflow process activates the flux 119 to help remove oxides from the reflowed solder 131a and from the bondable feature 121 to provide a better electrical contact. The second reflow process can utilize the same reflow conditions as the first reflow step described above, since what is being processed is still essentially the same solder composition to complete a solder joint between the metal posts 117 semiconductor on the IC die 110 and bondable feature 121. The resulting solder joint is shown in FIG. 1E as 131b.

Disclosed aspects solve problems for flip chip packages by printing the solder 131 generally in the form of a solder paste, such as SAC305 solder paste, directly on bondable features 121 of a package substrate. Disclosed aspects provide flexibility regarding the shapes and sizes of the solder bumps of the solder paste so that there can be two or more different solder bumps sizes and/or shapes while ensuring that the volatile components of the solder paste are removed prior to mounting the IC die 110 to the bondable features 121 on the package substrate, which can significantly reduce the concentration of solder voids in the solder joint 131b. Regarding solder joints, a small cavity formed inside the solder joint is conventionally called a 'void' which can have a significant negative impact on the reliability of the joint. When a significant concentration of voids are present in the solder joint, the solder joint strength is reduced, and voids responsive to stress can cause cracks to form in the solder joint. Disclosed solder joints generally have a void density of less than or equal to ($\leq$) 5% of a cross-sectional area of the solder joint, such as a void density of $\leq 2\%$.

FIG. 2A is a cross-sectional view of a semiconductor device assembly 200 shown as an FCOL plastic QFN package that has a disclosed solder joint 131b between the metal posts 117 on the bond pads 116 of the IC die 110 and lead terminals 210a of the leadframe 210, according to an example aspect. The mold compound is shown as 190.

FIG. 2B is a cross-sectional view of semiconductor device assembly 250 shown as a FCOL plastic QFN package that has a disclosed solder joint 131b between the metal posts 117 on the bond pads 116 of the IC die 110 and lead terminals 210a of the leadframe 210, according to an example aspect. The QFN package 250 further comprises an optional passive component (or device) 218, such as a capacitor, resistor, or inductor, and a second IC die 219 that also each have bondable features attached by the solder joint 131b to the lead terminals 210a of the leadframe 210.

FIG. 3A is a cross-sectional view of a semiconductor device assembly 300 comprising a solder bumped flipped IC die 110 having its metal posts 117 on bond pads 116 attached to bondable features 312 such as metal pads on an organic substrate 310 having through-vias 311 that has disclosed solder joints 131b, according to an example aspect. The organic substrate 310 is shown having a plurality of metal layers, with dielectric layers generally comprising a polymer material between the respective metal layers, with the top layer providing the bondable features 312. The through-vias 311 being through full thickness of the organic substrate 310 enables the mounting of the organic substrate 310 with its solder balls 315 shown arranged as a BGA, positioned opposite to the side of the IC die 110 on a PCB (not shown for simplicity) or another substrate. The semiconductor device assembly 300 is also shown including underfill 341.

Figure 3B:
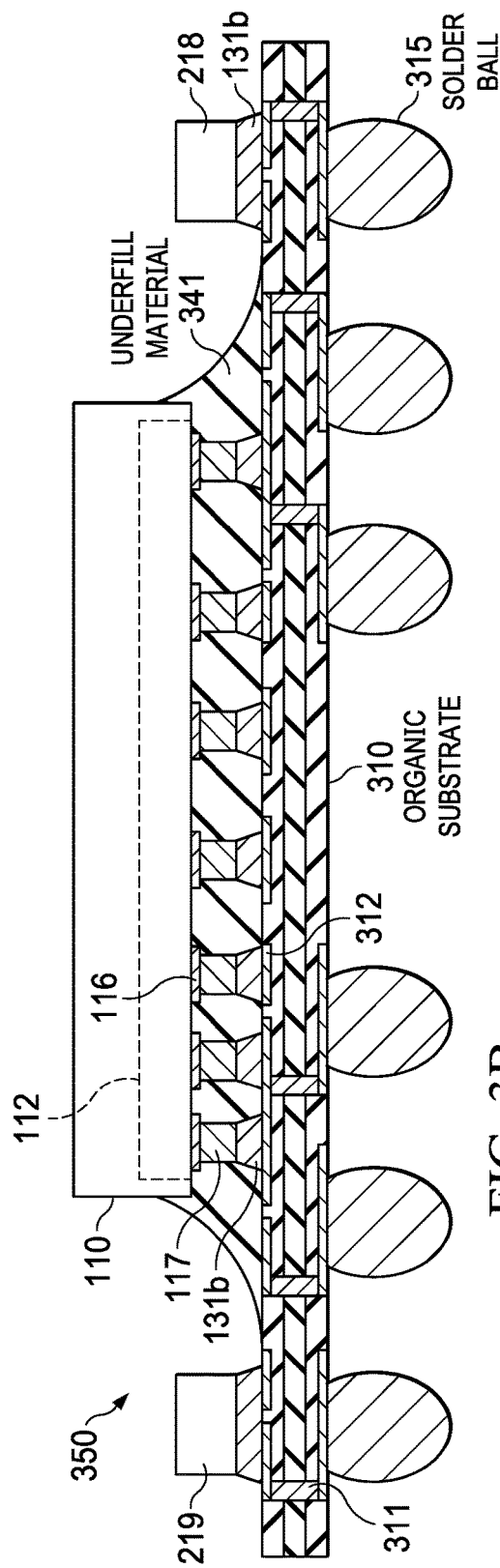
FIG. 3B is a cross-sectional view of a semiconductor device assembly that has disclosed solder joints assembly comprising a solder bumped IC die flip chip mounted onto bondable features on the organic substrate, and an optional passive device and an optional second IC die that also have bonding features bound to the bondable features of the organic substrate by a disclosed solder joint, according to an example aspect.

FIG. 3B is a cross-sectional view of a semiconductor device assembly 350 comprising a solder bumped flipped IC die 110 having its metal posts 117 on bond pads 116 attached to bondable features 312 of an organic substrate 310 having through-vias 311 that has disclosed solder joints 131b, according to an example aspect. The semiconductor device assembly 350 also includes an optional passive device 218, such as a resistor, capacitor, or inductor, and a second IC die 219, that each also has bonding features, such as copper posts, bound to the bondable features 312 of the organic substrate 310 by a solder joint 131b.

Disclosed aspects generally provide a relatively thick bond line thickness (BLT). A thicker BLT is enabled because the amount of solder paste utilized can be increased as the stencil thickness is increased. Disclosed aspects as described above generally also provide a lower concentration of solder joint voids as compared to conventional solder joints. The reason there is generally a lower concentration of solder joint voids is that disclosed methods as described above include performing two solder reflow steps including a first solder reflow step for reflowing solder on the bondable features of the package substrate prior to the mounting of the IC die on the package substrate which allows easier removal of volatile components or gases from the solder paste during reflow because there is no obstruction (due to no IC die on top) to prevent the removal of volatile components or gases from the solder paste. For a conventional solder process where the package substrate comprises a leadframe, the solder is already sandwiched between the metal post of the IC die and the leadframe during the reflow step, which explains why some of the volatile components/gases gets trapped or are not easily expelled during a conventional solder reflow process, resulting in a significant concentration of voids in the resulting solder joint. This reduced concentration of voids in disclosed solder joints is an advantage of disclosed assembly methods, particularly if a vacuum reflow oven is used for both of the respective solder reflows.

The BLT range for disclosed solder joints can be thicker as compared to conventional solder joints. Stencils with a thickness of about 40 μm to 100 μm, possibly even thicker depending on the desired solder paste volume and stencil aperture size, can be used to yield a BLT thickness in the range of around 35 μm to 80 μm (or higher). This assumes a conventional reduction in thickness for the BLT relative to a thickness of the wet BLT. Thus, using a relatively thick stencil and a relatively large solder paste volume as compared to conventional solder paste volumes, the BLT of a disclosed solder joint can be at least 55 μm, such as a BLT ranging from 55 μm to 80 μm.

Disclosed aspects can be integrated into a variety of assembly flows to form a variety of different semiconductor device assemblies and related products. The assembly can comprise single IC die or multiple IC or semiconductor die, such as configurations comprising a plurality of stacked IC die. A variety of package substrates may be used. The IC or semiconductor die may include various elements therein and/or layers thereon, including barrier layers, dielectric layers, device structures, active elements, and passive elements including source regions, drain regions, bit lines, bases, emitters, collectors, conductive lines, conductive vias, etc. Moreover, the IC or semiconductor die can be formed from a variety of processes including bipolar, insulated-gate bipolar transistor (IGBT), CMOS, BiCMOS, and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. A semiconductor device assembly, comprising:
a package substrate having a top side including a plurality of bondable features;
at least one integrated circuit (IC) die comprising a substrate including at least a semiconductor surface having circuitry configured for realizing at least one function including nodes coupled to bond pads with a metal post on each of the bond pads, each of the metal posts attached by a respective solder joint to a respective one of the plurality of bondable features,
wherein each of the solder joints comprises a lead-free alloy that contains 96.5% tin, 3% silver, and 0.5% copper and has a void density of less than or equal to (≤) 5% of a cross-sectional area of the solder joint.

2. The semiconductor device assembly of claim 1, wherein the package substrate comprises a leadframe including a plurality of lead terminals, further comprising a mold compound providing encapsulation for the IC die except for at least an exposed bottom contact to the plurality of lead terminals.

3. The semiconductor device assembly of claim 1, wherein the metal posts comprise copper pillars.

4. The semiconductor device assembly of claim 1, wherein a bond line thickness (BLT) of each solder joint is at least 55 μm.

5. The semiconductor device assembly of claim 4, wherein the BLT of each solder joint is 55 μm to 80 μm.

6. The semiconductor device assembly of claim 1, wherein the at least one IC die further comprises a second IC die also attached by respective solder joints to respective ones of the plurality of bondable features.

7. A semiconductor device assembly, comprising:
a multilayer organic substrate having a top side including a plurality of bondable features;
at least one integrated circuit (IC) die comprising a substrate including at least a semiconductor surface having circuitry configured for realizing at least one function including nodes coupled to bond pads with a metal post on each of the bond pads, each of the metal posts attached by a respective solder joint to a respective one of the plurality of bondable features,
wherein each of the solder joints comprises a lead-free alloy that contains 96.5% tin, 3% silver, and 0.5% copper and has a void density of less than or equal to (≤) 5% of a cross-sectional area of the solder joint.

8. A semiconductor device assembly, comprising:
a leadless leadframe having a top side including a plurality of bondable features;
at least one integrated circuit (IC) die comprising a substrate including at least a semiconductor surface having circuitry configured for realizing at least one function including nodes coupled to bond pads with a metal post on each of the bond pads, each of the metal posts attached by a respective solder joint to a respective one of the plurality of bondable features, wherein each of the solder joints comprises a lead-free alloy that contains 96.5% tin, 3% silver, and 0.5% copper and has a void density of less than or equal to (≤) 5% of a cross-sectional area of the solder joint.

9. A semiconductor device assembly, comprising:
a package substrate having a top side including a plurality of bondable features;
at least one integrated circuit (IC) die comprising a substrate including at least a semiconductor surface having circuitry configured for realizing at least one function including nodes coupled to bond pads with a metal post on each of the bond pads, each of the metal posts attached by a respective solder joint to a respective one of the plurality of bondable features;
at least one passive device selected from a resistor, capacitor, and an inductor positioned lateral to the IC die also attached by respective solder joints to respective ones of the plurality of bondable features; and
wherein each of the solder joints comprises a lead-free alloy that contains 96.5% tin, 3% silver, and 0.5% copper and has a void density of less than or equal to (≤) 5% of a cross-sectional area of the solder joint.

10. A semiconductor device assembly, comprising:
a package substrate having a top side including a plurality of bondable features;
at least one integrated circuit (IC) die comprising a substrate including at least a semiconductor surface having circuitry configured for realizing at least one function including nodes coupled to bond pads with a metal post on each of the bond pads, each of the metal posts attached by a respective solder joint to a respective one of the plurality of bondable features, further including an intermetallic compound (IMC) region in each of the solder joints and adjacent a respective corresponding bondable feature,
wherein each of the solder joints comprises a lead-free alloy that contains 96.5% tin, 3% silver, and 0.5% copper and has a void density of less than or equal to (≤) 5% of a cross-sectional area of the solder joint.

11. A semiconductor device assembly, comprising:
a package substrate having a top side including a plurality of bondable features; and
at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, wherein each of the solder joints comprise twice re-flown solder.

12. The semiconductor device assembly of claim 11, wherein each solder joint has a void density of less than or equal to (≤) 5% of a cross-sectional area of the solder joint.

13. The semiconductor device assembly of claim 11, wherein each of the solder joints comprise a lead-free alloy that contains 96.5% tin, 3% silver, and 0.5% copper.

14. The semiconductor device assembly of claim 11, wherein the metal posts comprise copper pillars.

15. The semiconductor device assembly of claim 11, wherein the at least one IC die further comprises a second IC die also attached by respective solder joints to respective ones of the plurality of bondable features.

16. A semiconductor device assembly, comprising:
a package substrate having a top side including a plurality of bondable features; and
at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, further including an intermetallic compound (IMC) region in each of the solder joints and adjacent a respective corresponding bondable feature, wherein the solder joints comprise twice re-flown solder.

17. A semiconductor device assembly, comprising:
a package substrate comprising a leadframe including a plurality of lead terminals, at least some of the lead terminals including a respective bondable feature;
at least one integrated circuit (IC) die comprising a substrate including at least a semiconductor surface having circuitry configured for realizing at least one function including nodes coupled to bond pads with metal posts on the bond pads, the metal posts attached by solder joints to the respective bondable features, wherein the solder joints comprise twice re-flown solder; and
a mold compound providing encapsulation for the IC die except for at least an exposed bottom contact to the plurality of lead terminals.

18. A semiconductor device assembly, comprising:
a multilayer organic package substrate having a top side including a plurality of bondable features; and
at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, wherein the solder joints comprise twice re-flown solder.

19. A semiconductor device assembly, comprising:
a package substrate comprising a leadless leadframe having a top side including a plurality of bondable features; and
at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, wherein the solder joints comprise twice re-flown solder.

20. A semiconductor device assembly, comprising:
a package substrate having a top side including a plurality of bondable features; and
at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, wherein the solder joints comprise twice re-flown solder, wherein a bond line thickness (BLT) of each of the solder joints is at least 55 μm.

21. The semiconductor device assembly of claim 20, wherein the BLT of the solder joint is 55 μm to 80 μm.

22. A semiconductor device assembly, comprising:

a package substrate having a top side including a plurality of bondable features;

at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features, wherein the solder joints comprise twice re-flown solder; and at least one passive device selected from a resistor, capacitor, and an inductor positioned lateral to the IC die also attached by respective solder joints to respective ones of the plurality of bondable features.

23. A semiconductor device assembly, comprising:

a package substrate having a top side including a plurality of bondable features;

at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features; and wherein volatile components of the solder used to form the solder joints are removed prior to mounting the IC die to the bondable features.

24. The semiconductor device assembly of claim 23, wherein each of the solder joints comprises a lead-free alloy that contains 96.5% tin, 3% silver, and 0.5% copper.

25. The semiconductor device assembly of claim 23, wherein the package substrate comprises a leadframe including a plurality of lead terminals, further comprising a mold compound providing encapsulation for the IC die except for at least an exposed bottom contact to the plurality of lead terminals.

26. A semiconductor device assembly, comprising:

a package substrate having a top side including a plurality of bondable features;

at least one integrated circuit (IC) die comprising a substrate including at least a semiconductor surface having circuitry configured for realizing at least one function including nodes coupled to bond pads with metal posts on the bond pads, the metal posts attached by solder joints to the plurality of bondable features;

wherein volatile components of the solder used to form the solder joints are removed prior to mounting the IC die to the bondable features; and wherein each of the solder joints comprise twice re-flown solder.

* * * * *